United States Patent
Shimazaki

[11] Patent Number: 5,812,025
[45] Date of Patent: Sep. 22, 1998

[54] AUTOMATIC-GAIN-CONTROL CIRCUIT COMPENSATING FOR CHANGES IN GAIN CONTROL CHARACTERISTICS

[75] Inventor: Yoshihito Shimazaki, Tokyo, Japan

[73] Assignee: Oki Electric Industry Co., Ltd., Tokyo, Japan

[21] Appl. No.: 784,257

[22] Filed: Jan. 15, 1997

[30] Foreign Application Priority Data

Jan. 22, 1996 [JP] Japan ................................ 8-008303

[51] Int. Cl.$^6$ ................................................. H03G 3/30
[52] U.S. Cl. .......................... 330/129; 330/279; 330/289; 455/234.2
[58] Field of Search .................................. 330/129, 279, 330/289; 455/234.2, 246.1, 247.1

[56] References Cited

U.S. PATENT DOCUMENTS 5,617,060  4/1997  Wilson et al. ........................ 330/129

OTHER PUBLICATIONS

Soeya et al., "Direct Conversion Receiver with Baseband AGC," Paper from the 1993 Spring Meeting of the Institute of Electronics, Information, and Communication Engineers of Japan, pp. 2–323.

*Primary Examiner*—James B. Mullins
*Attorney, Agent, or Firm*—Spencer & Frank

[57] ABSTRACT

According to a first aspect of the invention, an automatic-gain-control circuit, which generates a control signal that controls the gain of a variable-gain element, modifies the control signal to compensate for changes in the gain control characteristic of the variable-gain element. According to a second aspect of the invention, the automatic-gain-control modifies a fixed value which is added to cancel a direct-current offset, the modification being made in response to changes in the gain control characteristic of the variable-gain element.

29 Claims, 4 Drawing Sheets

AUTOMATIC-GAIN-CONTROL CIRCUIT COMPENSATING FOR CHANGES IN GAIN CONTROL CHARACTERISTICS

BACKGROUND OF THE INVENTION

This invention relates to an automatic-gain-control circuit, more particular to an automatic-gain-control circuit that compensates for changes in gain control characteristics, as well as for changes in received signal strength.

Automatic-gain-control circuits, generally referred to as AGC circuits, are widely used in devices such as radio receivers to compensate for variations in received signal strength. Basically, an AGC circuit generates a control signal responsive to the signal strength, and uses this control signal to control the gain of an AGC amplifier that amplifies the received signal. The amplified level of the received signal is thereby kept within the range of linear operation of other circuit elements that process the received signal.

A problem in this type of AGC circuit is that the gain control characteristic of the AGC amplifier itself may change, due to temperature changes, for example. A further problem is that the AGC circuit may be employed in a series of products having different amplification requirements, resulting in the use of AGC amplifiers with different gain characteristics. This situation is by no means uncommon. If the gain control characteristic of the AGC amplifier changes, however, the AGC control signal may no longer be able to keep the amplified received signal within the necessary range.

A conventional method of compensating for changes in AGC characteristics caused by the use of different AGC amplifiers is to add one or more compensatory amplifier stages in front of the AGC amplifier. This solution is costly and inconvenient, however, in that it requires the design, installation, and adjustment of the compensatory amplifier stages.

SUMMARY OF THE INVENTION

One object of this invention to compensate for temperature-induced changes in gain control characteristics.

Another object of the invention to compensate for changes in gain control characteristics due to the use of different variable-gain elements.

Like AGC circuits in general, the invented AGC circuit has a variable-gain element that amplifies an input signal by a variable gain factor responsive to a control signal, an offset canceling means that adds a fixed quantity to the resulting gain-adjusted signal to adjust for a direct-current offset, a calculation means that calculates a signal strength value from the resulting offset-adjusted signal, a difference means that finds differences between the signal strength value and a reference value, an accumulating means that calculates a cumulative sum of these differences, and an operation means that performs a fixed operation on the cumulative sum, thereby generating the control signal that controls the gain factor of the variable-gain element.

According to a first aspect of the invention, the invented AGC circuit also has a first compensation means that either modifies the control signal directly, or modifies the cumulative sum, thereby modifying the control signal indirectly. The modification is made responsive to the gain control characteristic of the variable-gain element.

According to a second aspect of the invention, the invented AGC circuit has a second compensation means that modifies the fixed value added by the offset canceling means, responsive to the gain control characteristic of the variable-gain element.

DETAILED DESCRIPTION OF THE INVENTION

The invention will now be described by way of example through the embodiments below.

The first embodiment is the AGC circuit of a wireless receiver that converts a received radio signal directly from the radio-frequency band to the baseband. The conversion is performed by mixing the radio-frequency signal with a pair of orthogonal local carrier signals, generating analog in-phase (I) and quadrature (Q) baseband signals. This type of direct conversion is employed in devices such as pagers.

Figure 1:
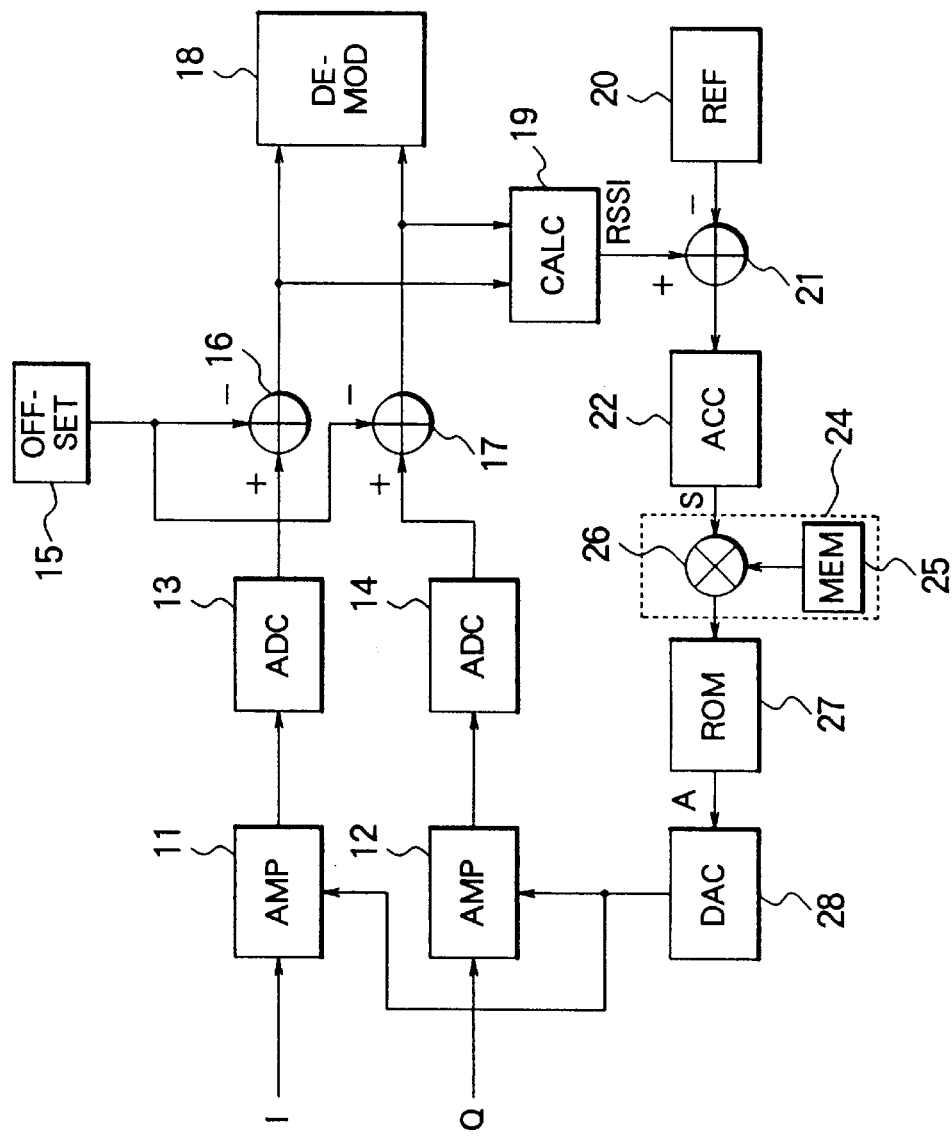
FIG. 1 is a block diagram illustrating a first embodiment of the invention.

Referring to FIG. 1, the I and Q baseband signals are amplified by a pair of variable-gain amplifiers 11 and 12, and the gain-adjusted signals output by these amplifiers are converted from analog to digital form by a pair of analog-to-digital converters (ADCs) 13 and 14. A fixed offset compensation value, stored in an offset register 15, is added to both the digitized I and Q signals by adders 16 and 17, to cancel the direct-current (DC) component of these signals. The offset value stored in the offset register 15 should be equal in magnitude but opposite in sign to the DC component. The DC component can be determined by supplying a sine-wave test signal to the receiver as a radio-frequency input signal, for example, and finding the average resulting output of the ADCs 13 and 14.

The offset-adjusted I and Q signals from adders 16 and 17 are furnished to a digital demodulator 18 that extracts received data from the signals, and to a signal strength calculator 19. The signal strength calculator 19 calculates the combined energy of the offset-adjusted I and Q signals, by taking the sum of the squares of the signal values, for example, to produce a radio signal strength indicator signal (RSSI). RSSI is supplied together with a reference value (REF), which is stored in a reference register 20, to a subtractor 21 that subtracts REF from RSSI to obtain their difference. This difference is input to an accumulator (ACC) 22 that produces a cumulative sum S of the difference values.

The output S of the accumulator 22 is supplied to a novel compensator 24 that compensates for the gain control characteristics of the amplifiers 11 and 12. In the first embodiment the compensator 24 comprises a memory (MEM) unit 25 and a multiplier 26. The multiplier 26 multiplies S by a value stored in the memory unit 25.

The resulting product is output from the compensator 24 as an address signal to a read-only memory (ROM) 27. The ROM 27 outputs a value A stored at the corresponding address to a digital-to-analog converter (DAC) 28, which converts A to an analog control signal. This analog control signal controls the gain of amplifiers 11 and 12, which have a continuously variable gain factor.

Next, the operation of the first embodiment will be explained.

The values stored in the ROM 27 are adapted for correct automatic gain control when the amplifiers 11 and 12 have a certain gain control characteristic $G_1$. In particular, the values stored in the ROM 27 are adapted to keep the I and Q signals within the allowable input range of the ADCs 13 and 14 when amplifiers 11 and 12 have gain control characteristic $G_1$. The ROM 27 implements a fixed mathematical function, performing a fixed operation on the product output by the multiplier 26. This operation, as defined by the values stored in the ROM 27, is designed to provide the AGC loop with a desired response speed while avoiding oscillation of gain control.

The gain control characteristic $G_1$ specifies the way in which the gain of amplifiers 11 and 12 depends on the control signal A. It will be assumed below that the gain is proportional to A, that $G_1$ is the constant of proportionality, and that the value of A decreases with increasing address value in the ROM 27.

When amplifiers 11 and 12 operate with gain control characteristic $G_1$, the memory unit 25 outputs a value of unity, so that the cumulative sum S obtained by the accumulator 22 is supplied without change to the ROM 27. If RSSI exceeds REF, S increases in value, causing the ROM 27 to output values A from increasingly higher addresses. The ROM 27 thus outputs increasingly smaller values of A, which reduce the gain of amplifiers 11 and 12 until RSSI becomes equal to REF. If RSSI becomes less than REF, the output S of the accumulator 22 decreases, causing the ROM 27 to output increasing values of A, thus increasing the amplifier gain until RSSI again becomes equal to REF. Thus the AGC circuit operates to keep the I and Q baseband signals at a constant combined level, corresponding to an RSSI value equal to REF, despite fading and other disturbances in signal strength.

If the gain control characteristic of the amplifiers 11 and 12 changes to a different characteristic $G_2$, either because of a temperature change or because of a design change causing the use of different amplifiers 11 and 12, the value output from the memory unit 25 is altered accordingly. Specifically, the memory output is changed from unity to a value equal to $G_2/G_1$. The multiplier 26 then outputs an address signal equal to $SG_2/G_1$, and the ROM 27 outputs a value A from this address. As a result, the AGC circuit is able to provide the desired response speed and avoid oscillation, despite the altered gain control characteristics.

Alterations in the value from the output memory in response to temperature changes can be made by means of a temperature sensor (not visible), and a circuit (also not visible) that sends different low-order address signals to the memory unit 25 responsive to the sensed temperature. Design changes in the amplifiers 11 and 12 can be handled by changing the values of high-order address bits supplied to the memory unit 25. The memory 25 thus stores a separate table of temperature compensation values for each type of amplifier that may be employed. When the AGC circuit is designed, the usable types of amplifiers and their gain characteristics are ordinarily known, so the data for these tables can be easily obtained.

By providing a means of temperature compensation in the AGC circuit, the first embodiment can significantly improve automatic-gain-control performance. By providing a means of adapting to different amplifier characteristics, the first embodiment greatly simplifies the making of design changes in receiver equipment, since no compensatory amplifiers have to be installed or adjusted; this leads to attendant savings in cost and time.

Figure 2:
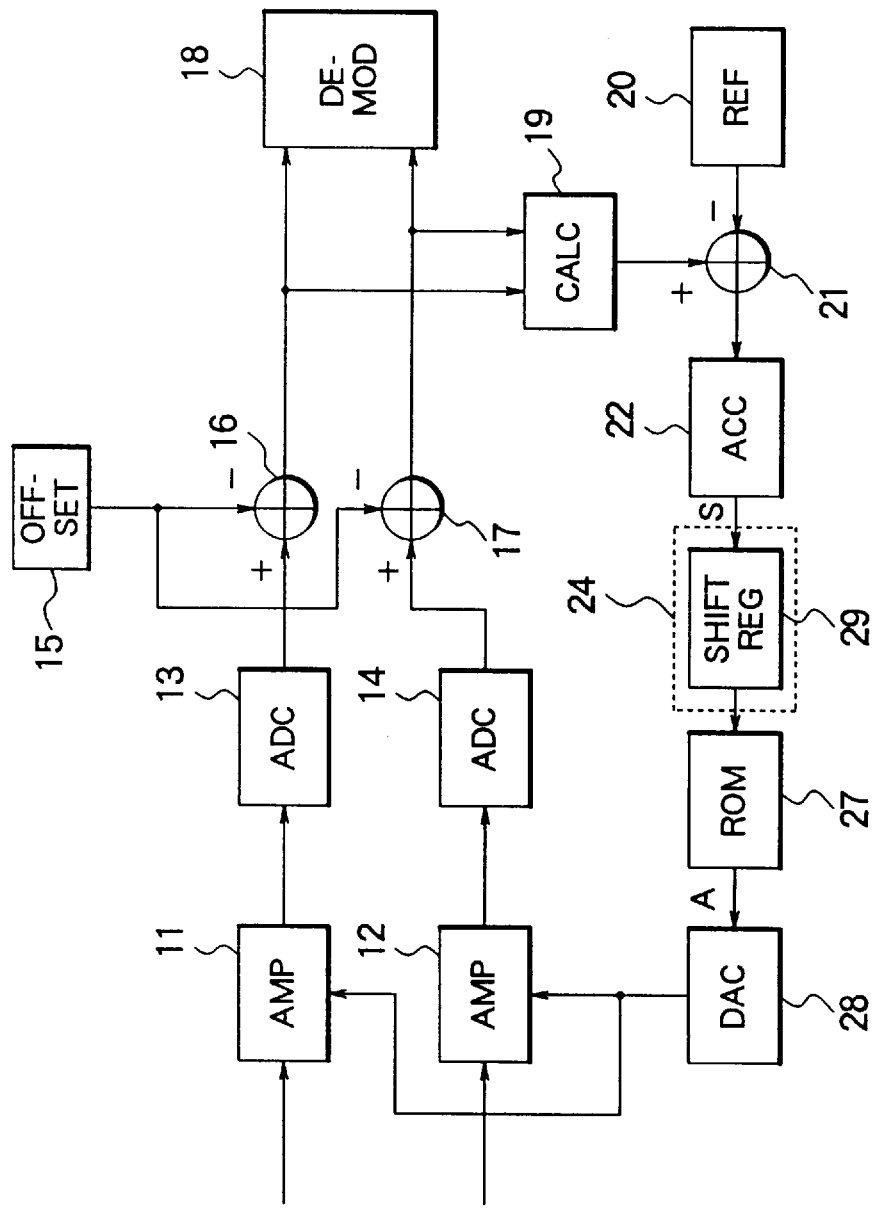
FIG. 2 is a block diagram illustrating a second embodiment of the invention.

FIG. 2 shows a second embodiment of the invention, using the same reference numerals as in FIG. 1 for equivalent parts. The second embodiment is identical to the first embodiment except for the compensator 24, which in the second embodiment comprises a shift register 29 instead of a memory unit and multiplier.

The shift register 29 shifts the accumulator output signal S right or left by a controllable number of bits, thereby multiplying or dividing S by a power of two. An m-bit left shift, where m is an arbitrary positive integer, produces the following value:

$$S \times 2^m$$

An m-bit right shift produces the following value:

$$S \times 2^{-m} = S/2^m$$

The shift register 29 can also perform a zero-bit shift, thus passing the unaltered value of S to the ROM 27.

$$S \times 2^0 = S$$

The second embodiment is useful when, for example, the amplifiers 11 and 12 belong to a family of amplifiers with gain control characteristics that are related by successive powers of two. Such amplifier families are in common use. The second embodiment enables design changes to be made within such a family, simply by changing the size and/or direction of the bit shift performed by the shift register 29.

Figure 3:
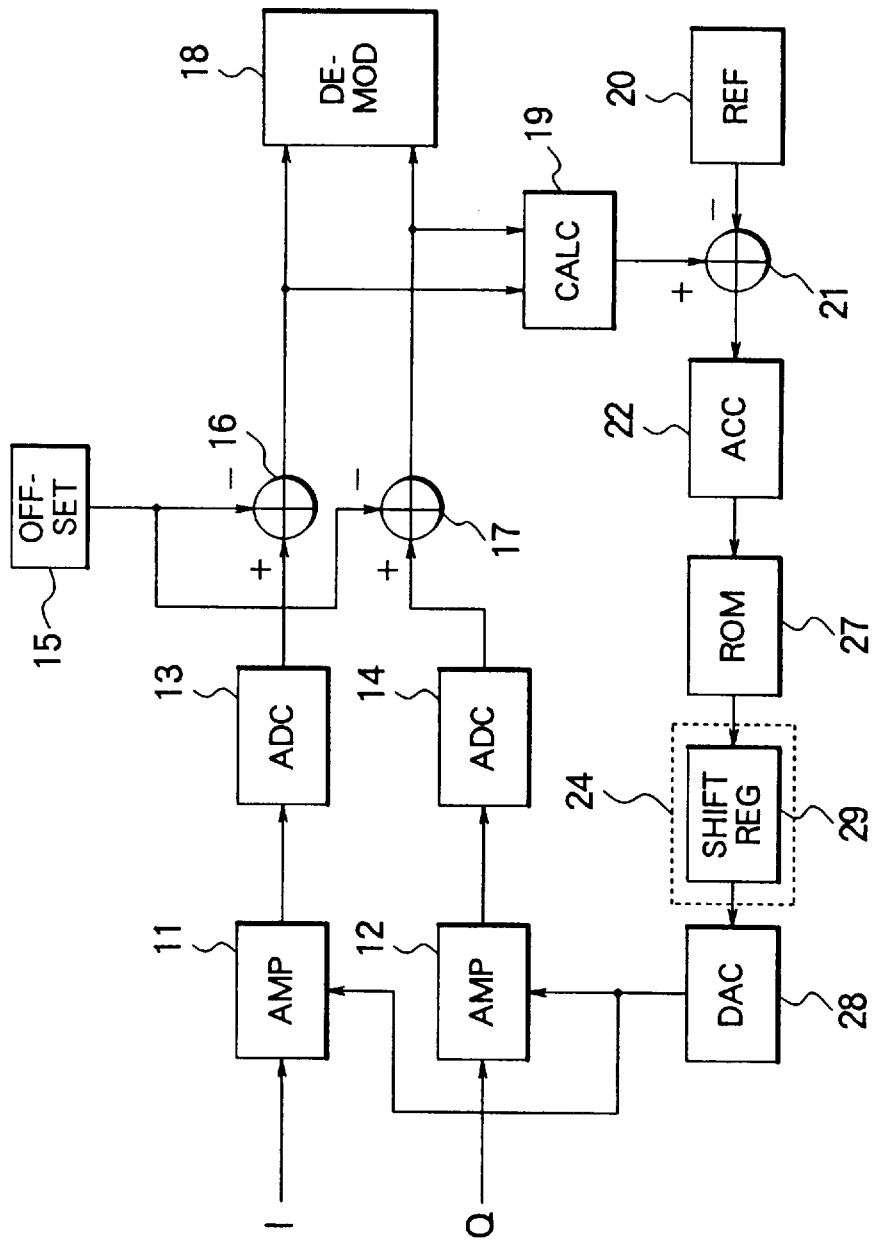
FIG. 3 is a block diagram illustrating a third embodiment of the invention.

FIG. 3 shows a third embodiment, using the same reference numerals as in FIG. 2 for equivalent parts. The third embodiment is identical to the second embodiment except that the positions of the compensator 24 and ROM 27 have been interchanged. Compensation for the gain control characteristics of the amplifiers 11 and 12 is thus applied to the output, instead of the input, of the ROM 27.

The choice between the second and third embodiments is a design choice to be made depending on the contents of the ROM 27 and the type of gain control characteristic (e.g. linear or logarithmic) possessed by the amplifiers 11 and 12.

Figure 4:
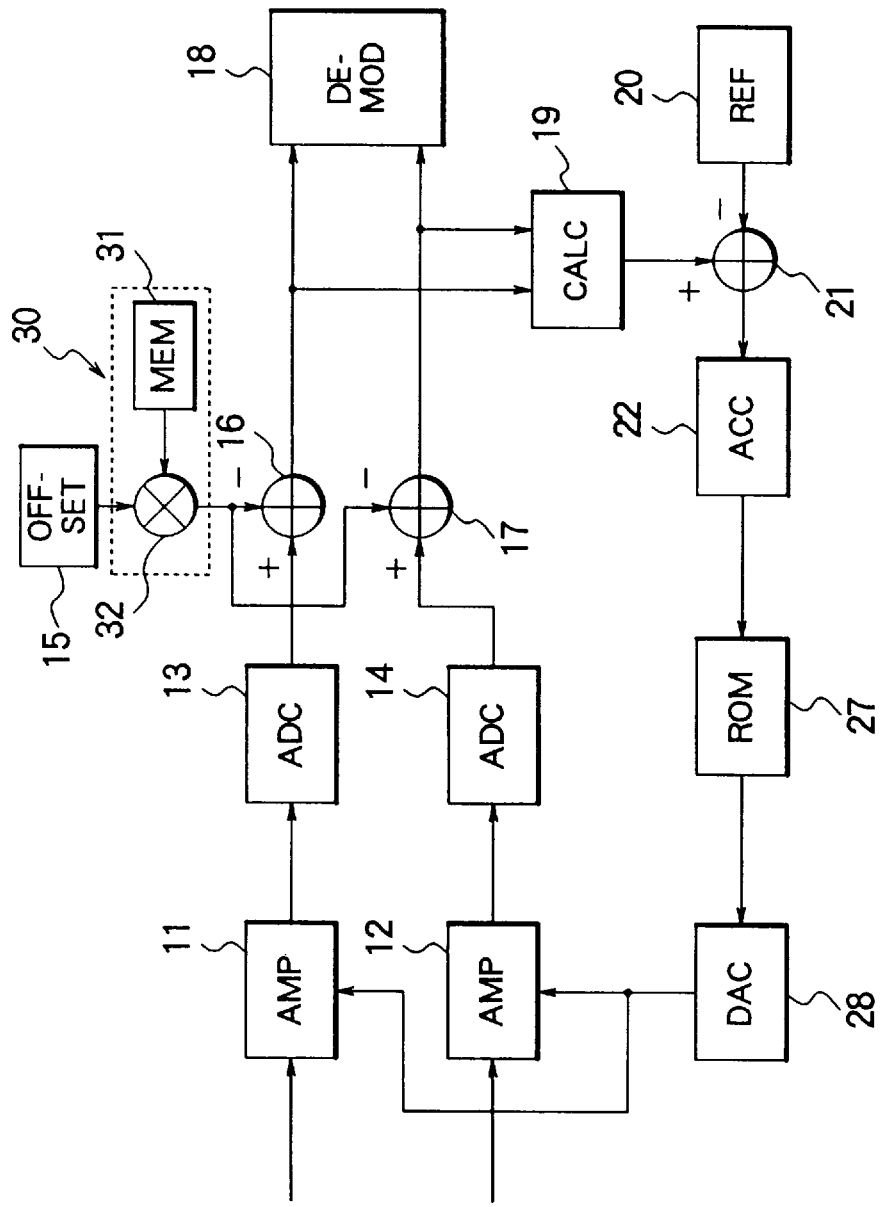
FIG. 4 is a block diagram illustrating a fourth embodiment of the invention.

FIG. 4 shows a fourth embodiment, using the same reference numerals as in FIG. 1 for equivalent parts. The compensator 30 in the fourth embodiment, which comprises a memory unit 31 and multiplier 32, is disposed between the offset register 15 and adders 16 and 17, instead of being disposed between the accumulator 22 and ROM 27. Memory unit 31 is similar to memory unit 25 in the first embodiment, storing values equivalent to $G_2/G_1$. The multiplier 32 multiples the fixed offset value stored in the offset register 15 by $G_2/G_1$. Adders 16 and 17 add the resulting product to the digitized I and Q signals.

When the gain of amplifiers 11 and 12 changes, a corresponding change occurs in the DC offset of the digitized I and Q signals. If the gain doubles, for example, the DC offset also doubles. By multiplying the compensatory offset value stored in the offset register 15 by the factor $G_2/G_1$, the multiplier enables the DC offset to be canceled correctly. Memory unit 31 has, for example, the same structure as the memory unit 26 of the first embodiment, containing temperature-compensation tables for different types of amplifiers.

The invention is not limited to the embodiments above, but can be modified in various ways.

The received signal input to the AGC circuit may be a single signal, instead of a pair of signals.

The amplifiers 11 and 12 need not be amplifiers as such, but may be any type of variable-gain element, including elements in the circuits that convert the received signal from the radio-frequency band to the baseband.

Analog-to-digital conversion need not be performed between these amplifiers and the adders 16 and 17 that cancel the DC offset. Analog-to-digital conversion can be performed at other points in the AGC circuit, or the entire AGC circuit can operate as an analog circuit.

The signal strength calculator 19 is not restricted to calculating the combined energy of the I and Q signals, but can calculate any quantity that indicates the received signal strength, such as the field strength of the received signal.

The ROM 27 can be replaced by any type of circuit that performs a fixed mathematical operation on the output of the accumulator 22.

Digital-to-analog conversion of the output of the ROM 27 need not be performed if the gain of the amplifiers 11 and 12 can be digitally controlled.

The compensator 24 in the third embodiment may have the configuration shown in the first embodiment, comprising a memory unit and multiplier.

In the fourth embodiment, the compensator 30 may comprises a shift register as in the second embodiment. Alternatively, the offset register 15 and compensator 30 may be replaced by a read-only memory containing tables of different offset values, which are supplied selectively to adders 16 and 17, according to the gain control characteristic of the amplifiers 11 and 12.

The fourth embodiment may be combined with any of the first three embodiments to compensate both the offset value and the cumulative sum S (or control signal A) according to the gain control characteristic of the amplifiers 11 and 12.

The invention is not restricted to use in wireless receivers that convert directly from the radio-frequency band to the baseband. Other uses are possible in, for example, wireless transceivers, wireline transceivers, repeaters, video detectors in television sets, and various types of control devices, including temperature control devices.

Those skilled in the art will recognize that further modifications are possible within the scope claimed below.

What is claimed is:

1. An automatic-gain-control circuit, comprising:
   a variable-gain means receiving an input signal and a control signal, for amplifying said input signal by a variable gain factor responsive to said control signal, thereby generating a gain-adjusted signal;
   an offset canceling means coupled to said variable-gain means, for adding a fixed quantity to said gain-adjusted signal, thereby generating an offset-adjusted signal;
   a calculation means coupled to said offset canceling means, for calculating a signal strength value from said offset-adjusted signal;
   a difference means coupled to said calculation means, for calculating differences between said signal strength value and a reference value;
   an accumulating means coupled to said difference means, for calculating a cumulative sum of the differences calculated by said difference means;
   a first compensation means coupled to said accumulating means, for modifying said cumulative sum responsive to a gain control characteristic of said variable-gain means, thereby generating a modified cumulative sum; and
   an operation means coupled to said first compensation means, for performing a fixed operation on said modified cumulative sum, thereby generating said control signal.

2. The automatic-gain-control circuit of claim 1, wherein said first compensation means comprises:
   a memory means storing different compensation values, corresponding to different gain control characteristics, for providing a particular compensation value corresponding to the gain control characteristic of said variable-gain means; and
   a multiplier for multiplying said cumulative sum by said compensation value.

3. The automatic-gain-control circuit of claim 2, wherein said different compensation values correspond to different operating temperatures of said variable-gain element.

4. The automatic-gain-control circuit of claim 2, wherein said different compensation values correspond to different designs of said variable-gain element.

5. The automatic-gain-control circuit of claim 1, wherein said first compensation means comprises:
   a shift register for shifting said cumulative sum by a number of bits responsive to the gain control characteristic of said variable-gain element.

6. The automatic-gain-control circuit of claim 1, also comprising a second compensation means coupled to said offset canceling means, for modifying said fixed quantity responsive to the gain control characteristic of said variable-gain element.

7. The automatic-gain-control circuit of claim 1, also comprising an analog-to-digital converter disposed between said variable-gain element and said offset canceling means, for converting said gain-adjusted signal to digital form.

8. The automatic-gain-control circuit of claim 1, also comprising a digital-to-analog converter disposed between said operation means and said variable-gain means, for for converting said control signal to analog form.

9. The automatic-gain-control circuit of claim 8, wherein said variable-gain element has a continuously variable gain.

10. The automatic-gain-control circuit of claim 1, wherein said calculation means calculates said signal strength by calculating an energy value.

11. An automatic-gain-control circuit, comprising:
    a variable-gain means receiving an input signal and a control signal, for amplifying said input signal by a variable gain factor responsive to said control signal, thereby generating a gain-adjusted signal;
    an offset canceling means coupled to said variable-gain means, for adding a fixed quantity to said gain-adjusted signal, thereby generating an offset-adjusted signal;
    a calculation means coupled to said offset canceling means, for calculating a signal strength value from said offset-adjusted signal;
    a difference means coupled to said calculation means, for calculating differences between said signal strength value and a reference value;
    an accumulating means coupled to said difference means, for calculating a cumulative sum of the differences calculated by said difference means;
    an operation means coupled to said accumulating means, for performing a fixed operation on said cumulative sum, thereby generating an output signal; and
    a first compensation means coupled to said operation means, for modifying the output signal of said operation means responsive to a gain control characteristic of said variable-gain means, thereby generating said control signal.

12. The automatic-gain-control circuit of claim 11, wherein said first compensation means comprises:

a memory means storing different compensation values, corresponding to different gain control characteristics, for providing a particular compensation value corresponding to the gain control characteristic of said variable-gain means; and a multiplier for multiplying the output value of said operation means by the compensation value provided by said memory means.

13. The automatic-gain-control circuit of claim 12, wherein said different compensation values correspond to different operating temperatures of said variable-gain element.

14. The automatic-gain-control circuit of claim 12, wherein said different compensation values correspond to different designs of said variable-gain element.

15. The automatic-gain-control circuit of claim 11, wherein said first compensation means comprises:

a shift register for shifting said cumulative sum by a number of bits responsive to the gain control characteristic of said variable-gain element.

16. The automatic-gain-control circuit of claim 11, also comprising a second compensation means coupled to said offset canceling means, for modifying said fixed quantity responsive to the gain control characteristic of said variable-gain element.

17. The automatic-gain-control circuit of claim 11, also comprising an analog-to-digital converter disposed between said variable-gain element and said offset canceling means, for converting said gain-adjusted signal to digital form.

18. The automatic-gain-control circuit of claim 11, also comprising a digital-to-analog converter disposed between said first compensation means and said variable-gain means, for for converting said control signal to analog form.

19. The automatic-gain-control circuit of claim 18, wherein said variable-gain element has a continuously variable gain.

20. The automatic-gain-control circuit of claim 11, wherein said calculation means calculates said signal strength by calculating an energy value.

21. An automatic-gain-control circuit, comprising:

a variable-gain means receiving an input signal and a control signal, for amplifying said input signal by a variable gain factor responsive to said control signal, thereby generating a gain-adjusted signal;

an offset canceling means coupled to said variable-gain means, for adding a fixed quantity to said gain-adjusted signal, thereby generating an offset-adjusted signal;

a compensation means coupled to said offset canceling means, for modifying said fixed quantity, responsive to a gain control characteristic of said variable-gain element;

a calculation means coupled to said offset canceling means, for calculating a signal strength value from said offset-adjusted signal;

a difference means coupled to said calculation means, for calculating differences between said signal strength value and a reference value;

an accumulating means coupled to said difference means, for calculating a cumulative sum of the differences calculated by said difference means; and an operation means coupled to said accumulating means, for performing a fixed operation on said cumulative sum, thereby generating said control signal.

22. The automatic-gain-control circuit of claim 21, wherein said compensation means comprises:

a memory means storing different compensation values, corresponding to different gain control characteristics, for providing a particular compensation value corresponding to the gain control characteristic of said variable-gain means; and a multiplier for multiplying said fixed quantity by the compensation value provided by said memory means.

23. The automatic-gain-control circuit of claim 22, wherein said different compensation values correspond to different operating temperatures of said variable-gain element.

24. The automatic-gain-control circuit of claim 22, wherein said different compensation values correspond to different designs of said variable-gain element.

25. The automatic-gain-control circuit of claim 21, wherein said compensation means comprises:

a shift register for shifting said cumulative sum by a number of bits responsive to the gain control characteristic of said variable-gain element.

26. The automatic-gain-control circuit of claim 21, also comprising an analog-to-digital converter disposed between said variable-gain element and said offset canceling means, for converting said gain-adjusted signal to digital form.

27. The automatic-gain-control circuit of claim 21, also comprising a digital-to-analog converter disposed between said operation means and said variable-gain means, for for converting said control signal to analog form.

28. The automatic-gain-control circuit of claim 27, wherein said variable-gain element has a continuously variable gain.

29. The automatic-gain-control circuit of claim 21, wherein said calculation means calculates said signal strength by calculating an energy value.

* * * * *